(12) United States Patent
Machida et al.

(10) Patent No.: US 7,521,712 B2
(45) Date of Patent: Apr. 21, 2009

(54) THIN FILM SEMICONDUCTOR DEVICE

(75) Inventors: Akio Machida, Kanagawa (JP); Toshio Fujino, Kanagawa (JP); Tadahiro Kono, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/685,550

(22) Filed: Mar. 13, 2007

(65) Prior Publication Data
US 2007/0212825 A1 Sep. 13, 2007

(30) Foreign Application Priority Data
Mar. 13, 2006 (JP) ............................ P2006-067273
Dec. 25, 2006 (JP) ............................ P2006-347053

(51) Int. Cl.
*H01L 29/76* (2006.01)
(52) U.S. Cl. .............................. 257/66; 257/65; 257/64; 257/74; 257/75; 438/166; 438/795; 438/E21.134; 438/E27.111
(58) Field of Classification Search ......... 438/166–163, 438/308, 378, 795; 257/59–66, 72–75
See application file for complete search history.

(56) References Cited

U.S. PATENT DOCUMENTS

2007/0040176 A1* 2/2007 Kato et al. .................... 257/66

FOREIGN PATENT DOCUMENTS

JP 2006-77834 3/2003
JP 2005-012030 1/2005

OTHER PUBLICATIONS

Voutsas et al. "Effect of process parameters on the structural characteristics of laterally grown, laser-annealed polycrystalline," Journal of Applied Physics, vol. 94, pp. 7445-7452, 2003.
Yamaguchi et al., "Modeling and characterization of polycrystalline-silicon thin-film transistors with a channel-length comparable to a grain size," Journal of Applied Physics, vol. 89, pp. 590-595, 2001.
Kimura et al., "Extraction of Trap States at the Oxide-Silicon Interface and Grain Boundary for Polycrystalline Silicon Thin-Film Transistors," Jpn. J. Appl. Phys. vol. 40, Part I, No. 9A, Sep. 2001, pp. 5227-5236.
Kimura et al., "Device Simulation of Carrier Transport through Grain Boundaries in Lightly Doped Polysilicon Films and Dependence on Dopant Density," Jpn. J. Appl. Phys. vol. 40, Part I, No. 9A, Sep. 2001, pp. 5237-5243.

* cited by examiner

*Primary Examiner*—Dung A. Le
(74) *Attorney, Agent, or Firm*—K&L Gates LLP (57) ABSTRACT

A thin film semiconductor device is provided that includes a semiconductor thin film and a gate electrode. The semiconductor thin film has an active region turned into a polycrystalline region through irradiation with an energy beam. The gate electrode is provided to traverse the active region. In a channel part that is the active region overlapping with the gate electrode, a crystalline state is changed cyclically in a channel length direction, and areas each having a substantially same crystalline state traverse the channel part.

5 Claims, 7 Drawing Sheets

THIN FILM SEMICONDUCTOR DEVICE

CROSS REFERENCE TO RELATED APPLICATION

The present application claims priority to Japanese Patent Application JP 2006-067273 filed with the Japanese Patent Office on Mar. 13, 2006 and Japanese Patent Application JP 2006-347053 filed with the Japanese Patent Office on Dec. 25, 2006, the entire contents of which being incorporated herein by reference.

BACKGROUND

The present disclosure relates to a thin film semiconductor device and a method for manufacturing the same, and particularly to a thin film semiconductor device that includes plural elements obtained by crystallizing a semiconductor thin film through irradiation with an energy beam, and a method for manufacturing the same.

In a flat display such as a liquid crystal display, thin film transistors (TFTs) are employed as switching elements for active-matrix driving of plural pixels. The kinds of TFT include a TFT having an active region composed of polycrystalline silicon (poly-Si) (poly-Si TFT) and a TFT having an active region composed of non-crystalline silicon (amorphous Si) (a-Si TFT).

Compared with the a-Si TFT, the poly-Si TFT has carrier mobility higher by a factor of about 10 to 100, and a smaller degree of deterioration of the on-state current. It follows that the poly-Si TFT has superior characteristics as a switching element.

As a fabrication technique for the poly-Si TFT, there has been developed a so-called low-temperature poly-Si process, in which an amorphous silicon film is turned into a polycrystalline film by using only low-temperature processes at temperatures below about 600° C., for achievement of reduced substrate cost. For example, in a low-temperature poly-Si process employing an excimer laser, an amorphous silicon film is irradiated with pulses of laser light shaped into a line beam. In this irradiation, the irradiation position is so slightly shifted at every pulse irradiation that most parts of adjacent irradiated regions overlap with each other and the same position on the film is irradiated with the laser light pulse 10 to 20 times. This process results in achievement of a polycrystalline film having a crystal grain size uniformed across the entire active region.

As another example of the low-temperature poly-Si process, there has been proposed a method in which a crystallized region is formed by irradiating an amorphous silicon film with continuous laser light obtained from e.g. a harmonic of a YAG laser. During the irradiation, the laser light is moved at a constant speed so that the irradiation energy is equalized. After the forming of the crystallized region, patterning is so carried out that a region free from a crystal grain boundary is used as the active region of a thin film transistor (refer to Japanese Patent Laid-open No. 2003-77834 (in particular, paragraphs 0091, 0092 and 0169).

Furthermore, sequential lateral solidification (SLS) has been proposed by Columbia University and so forth as a method in which the width of lateral growth of a crystal is defined by multi-step irradiation with use of a mask (refer to A. T. Vouysas, A. Linmov, and J. S. Im, Journal of Applied Physics (2003), Vol. 94, P. 7445 to 7452.

In recent years, with regard to flat panel displays, liquid crystal displays allowing a high frame rate are being developed for further enhancement in moving image properties and contrast properties. In addition, novel displays such as self-luminous displays typified by organic EL displays are also being developed. Along with these developments, there has been an increasing demand for TFTs that suffer no characteristic deterioration even when large current is suddenly applied thereto, and of which characteristic variation is small, as switching elements applicable to these displays.

However, poly-Si TFTs obtained through the above-described existing low-temperature poly-Si process problematically involve larger variation in characteristics among elements, specifically, larger variation in the initial threshold voltage and on-state current in particular, compared with a-Si TFTs, although the poly-Si TFTs have great advantages such as easiness of application of comparatively large current thereto, higher carrier mobility, and smaller characteristic deterioration.

In order to prevent this variation, it has been attempted in the above-described crystallization employing an excimer laser to minimize variation among elements by forming a film in which similar crystals with a grain size of about 300 nm, equivalent to the wavelength of the laser light, have been grown. However, even using such a polycrystallized film may not offer a sufficient effect of suppressing the characteristic variation among elements.

This is because in crystallization by an existing method employing an excimer laser annealing apparatus, it is difficult to control the size of crystal grains in a poly-Si film with high accuracy and hence uneven grain size is obtained. The grain size unevenness leads to variation in the number of grain boundaries in a channel region among TFTs, which results in variation in characteristics of the TFTs (refer to e.g. K. Yamaguchi; et al; J. Appl. Phys., Vol. 89, No. 1, pp. 590, and M. Kimura et al; JAP. J. APPL. PHYSI. Vol. 40 Part 1 (2001), No. 1). In a display including organic EL elements as its display elements in particular, this problem is very serious because the variation appears as color unevenness and so on in the display part.

It is difficult even for the low-temperature poly-Si process described in Japanese Patent Laid-open No. 2003-77834 to sufficiently suppress the variation in characteristics of TFTs. This would be because each crystal region inside a channel region becomes large and therefore influence dependent upon the presence or absence of defects, dislocations and so on inside a crystal is greatly reflected in the characteristic variation. Furthermore, FIG. 8 in A. T. Vouysas, A. Limnov, and J. S. Im, Journal of Applied Physics (2003) shows that TFTs formed by the SLS method involves mobility variation larger than 10% even when the TFTs have been formed through the optimum process. This would be due to the existence of a myriad of uncontrolled grain boundaries in a crystal region in a laterally grown part.

Thus, there is a desire to provide a thin film semiconductor device in which transistor characteristics are controlled with high accuracy while small changes of the transistor characteristics over time and high carrier mobility are ensured, and to provide a method for manufacturing such a thin film semiconductor device.

SUMMARY

According to an embodiment, there is provided a thin film semiconductor device that includes a semiconductor thin film configured to have an active region turned into a polycrystalline region through irradiation with an energy beam, and a gate electrode configured to be provided to traverse the active region. Furthermore, in a channel part that is the active region overlapping with the gate electrode in particular, the crystalline state is changed cyclically in the channel length direction. In addition, areas each having a substantially same crystalline state traverse the channel part, and therefore the areas each having a same crystalline state range across the channel width.

In the thin film semiconductor device with such a configuration, carriers that are to pass the channel necessarily pass the boundaries of the cyclic change of the crystalline state. Therefore, regulating the cycle of the crystalline state change allows transistor characteristics (carrier mobility) of the thin film semiconductor device to be controlled with high accuracy. For example, by equalizing the magnitude of the cycle or the number of cycles disposed in the channel part, variation in carrier mobility among plural elements can be suppressed. Furthermore, it has been confirmed that in such a configuration, setting the crystalline state in each cycle to a predetermined state allows maintenance of high carrier mobility, which is an advantage of an element employing a semiconductor thin film turned into a polycrystalline film.

According to another embodiment, there is provided a method for manufacturing the thin film semiconductor device having the above-described configuration.

According to the embodiments, it is possible to achieve a thin film semiconductor device in which carrier mobility is controlled with high accuracy while small changes of element characteristics over time and high carrier mobility are ensured because of polycrystallization of the channel part. In this thin film semiconductor device, element characteristics are favorable and variation in the characteristics among the elements is small. Therefore, the performance of a display employing this thin film semiconductor device as its switching elements is high.

Additional features and advantages are described herein, and will be apparent from, the following Detailed Description and the figures.

DETAILED DESCRIPTION

An embodiment is described in detail below with reference to the accompanying drawings. In the following, initially a description will be made on a thin film semiconductor device, as an example of the embodiment, that includes plural top-gate poly-Si TFTs formed on the same substrate as switching elements for pixels in a display, followed by description of a manufacturing method thereof.

<Thin Film Semiconductor Device>

Figure 1A:
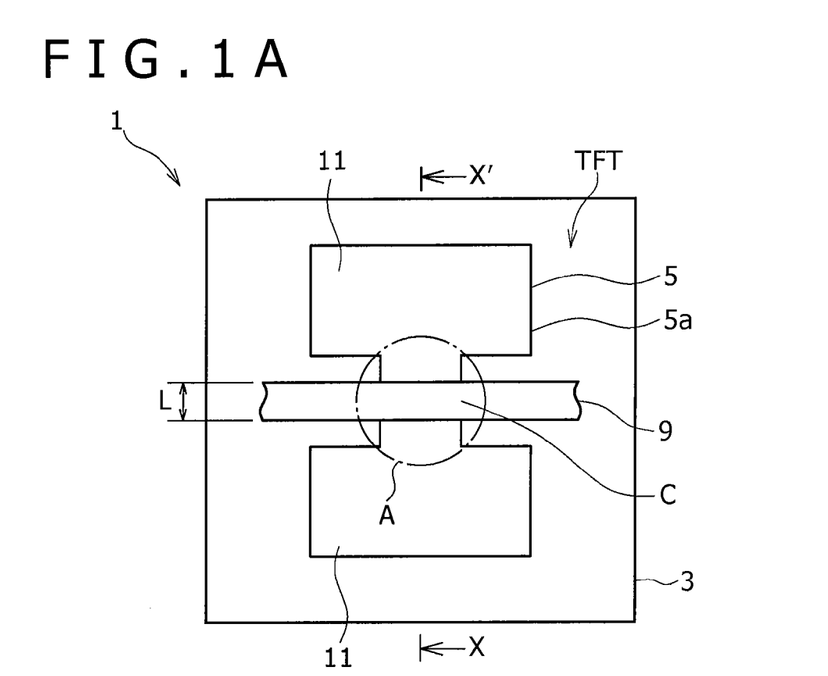
FIGS. 1A and 1B are plan views showing the configuration of a thin film semiconductor device according to an embodiment.
Figure 1B:
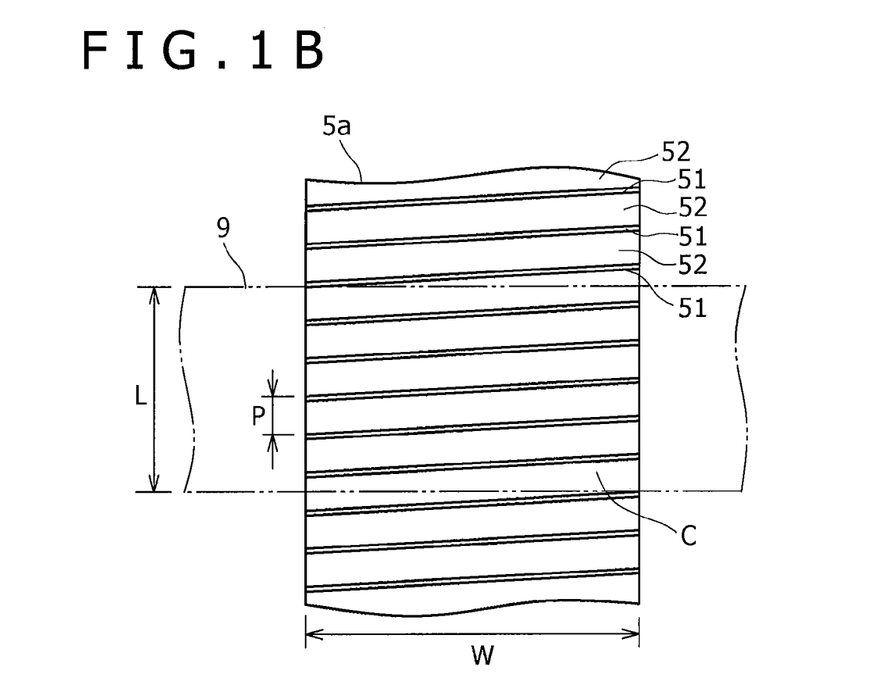

FIG. 1A is a plan view showing the configuration of the thin film semiconductor device according to the embodiment. FIG. 1B is an enlarged plan view showing part A in FIG. 1A. In a thin film semiconductor device 1 shown in these drawings, plural thin film transistors TFT are provided on the same substrate 3. Note that one thin film transistor TFT is illustrated in the drawings.

Each thin film transistor TFT includes an active region 5a formed of a semiconductor thin film 5 and a gate electrode 9 that is provided in such a manner as to traverse the center part of the active region 5a.

The active region 5a formed of the semiconductor thin film 5 includes a region turned into a polycrystalline region through irradiation of the semiconductor thin film 5 deposited as an amorphous silicon film with an energy beam such as laser light. The semiconductor thin film 5 is patterned into an island shape including the active region 5a. The semiconductor thin film 5 may be so pattered that no amorphous semiconductor thin film 5 is left around the crystallized active region 5a as shown in the drawing. Alternatively, the amorphous semiconductor thin film 5 may be left around the active region 5a.

The part of the active region 5a overlapping with the gate electrode 9 serves as a channel part C. The partial regions of the active region 5a on both the sides of the channel part C serve as source/drain 11.

In the present embodiment, each of the thin film transistors TFT with the above-described structure is characterized in the crystalline state in the active region 5a and the arrangement manner of the gate electrode 9 with respect to the crystalline state.

Specifically, at least in the channel part C overlapping with the gate electrode 9 in each active region 5a, the crystalline state is changed cyclically in the direction of the channel length L (i.e., the width direction of the gate electrode 9) substantially perpendicular to the extension direction of the gate electrode 9. That is, the crystalline state of the channel part C cyclically changes in the direction of the channel length L. The term "crystalline state" refers to the state of an area regarding whether the area is a crystalline or non-crystalline (amorphous) region, the crystal grain size, the presence or absence of a crystal grain boundary, the degree of impurity segregation dependent upon the density of grain boundaries, and so forth. Any of these states is changed cyclically in the direction of the channel length L.

The cyclic change of the crystalline state in the direction of the channel length L is continuous across the active region 5a, and areas each having a substantially same crystalline state traverse the channel part C. Therefore, the crystalline state is substantially equivalent across the channel width W (parallel to the extension direction of the gate electrode 9), substantially perpendicular to the direction of the channel length L. This cyclic change of the crystalline state may range across the whole of each active region 5a.

In the channel part C of the present embodiment in particular, amorphous areas 51 and crystalline areas 52 are alternately disposed, and hence each cycle of the crystalline state change includes the amorphous area 51 and the crystalline area 52. These amorphous and crystalline areas 51 and 52 each have a strip shape extending in the direction of the channel width W.

The line width of the gate electrode 9 (i.e., the channel length L) is designed based on the standards of the thin film transistor including this gate electrode 9. In the channel part C under the gate electrode 9, the amorphous areas 51 and the crystalline areas 52 are alternately disposed with a predetermined cycle. Furthermore, it is important that in thin film transistors TFT that are to have the same characteristics, the cycle of the amorphous areas 51 and the crystalline areas 52 in the channel part C is substantially the same. The expression "substantially the same cycle" refers to the state in which the amorphous areas 51 having substantially the same width and the crystalline areas 52 having substantially the same crystalline state are alternately provided with substantially the same number of cycles.

For example, if the width of the amorphous areas 51 is substantially the same and the crystalline state of the crystalline areas 52 is substantially the same, it is preferable that the number of cycles in the channel part C of each TFT be in the range of ±1 with respect to a predetermined number. As variation in the ratio of the actual number of cycles to a predetermined number is smaller, more uniform characteristics of the thin film transistors TFT can be achieved. Therefore, the number of amorphous areas 51 (i.e., the number of cycles of the crystalline state) provided in the channel part C should be two or more, and a larger number is more preferable. Specifically, it is preferable that the number of amorphous areas 51 extending in the direction of the channel width W in the channel part C be about 25. However, a larger total sum of the widths of the amorphous areas 51 that intersect with the direction of the channel length L in the channel part C yields lower carrier mobility in the direction of the channel length L. Therefore, it is preferable that the width of the amorphous areas 51 be as small as possible so that somewhat high carrier mobility can be kept.

Furthermore, in order to stabilize the number of amorphous areas 51 disposed in the channel part C, the widths of the amorphous areas 51 and the crystalline areas 52 are kept constant at least in the channel part C in the active region 5a.

Figure 2:
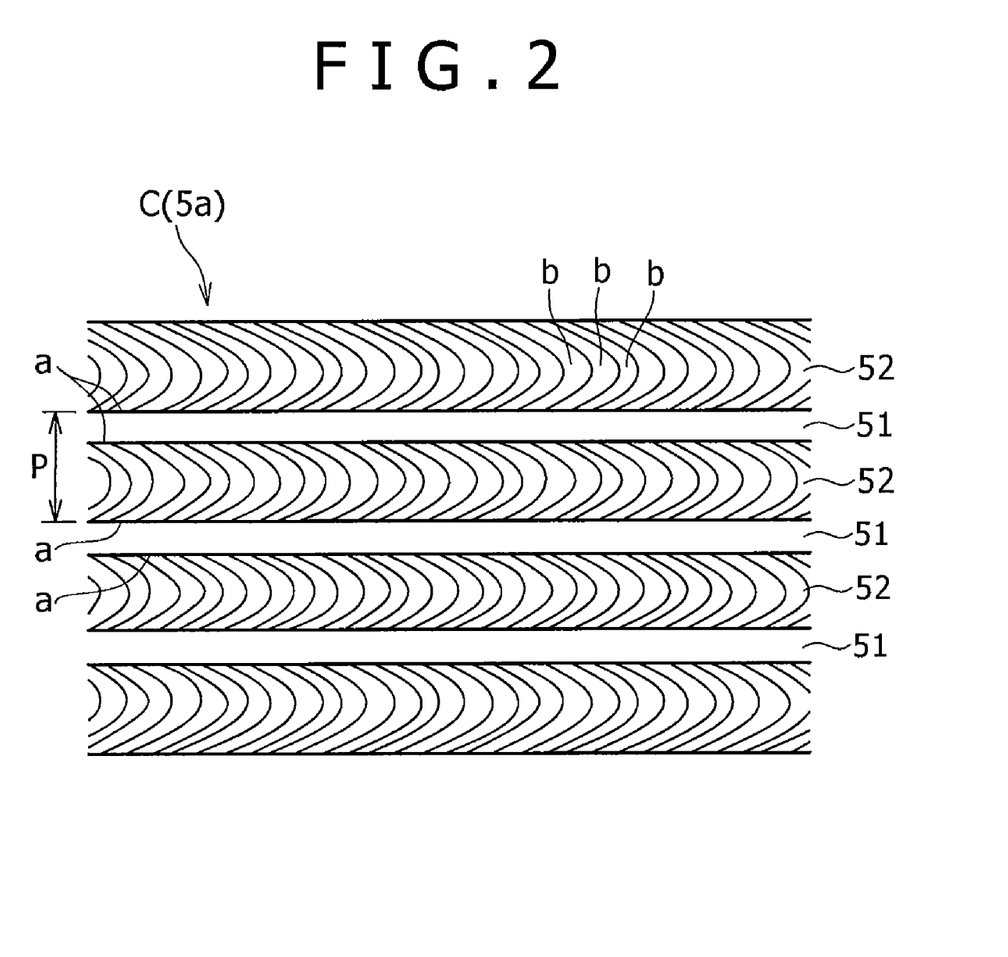
FIG. 2 is an enlarged plan view showing one example of the configuration of major part of the thin film semiconductor device according to an embodiment.

FIG. 2 shows one example of the more detailed structure of the channel part C. As shown in this enlarged plan view, in each crystalline area 52 in the channel part C (active region 5a) having the above-described cycle structure, crystal grains b each having a crescent shape convex in the extension direction of the crystalline areas 52 are arranged. These grains b each range across the width of the crystalline area 52, and are arranged on one row along the extension direction of the crystalline areas 52. Furthermore, in this channel part C, a crystal grain boundary a is provided between the amorphous area 51 and the crystalline area 52. Each grain boundary a is provided as a successive grain boundary that extends in the direction of the channel width W in such a manner as to traverse the channel part C.

Figure 3A:
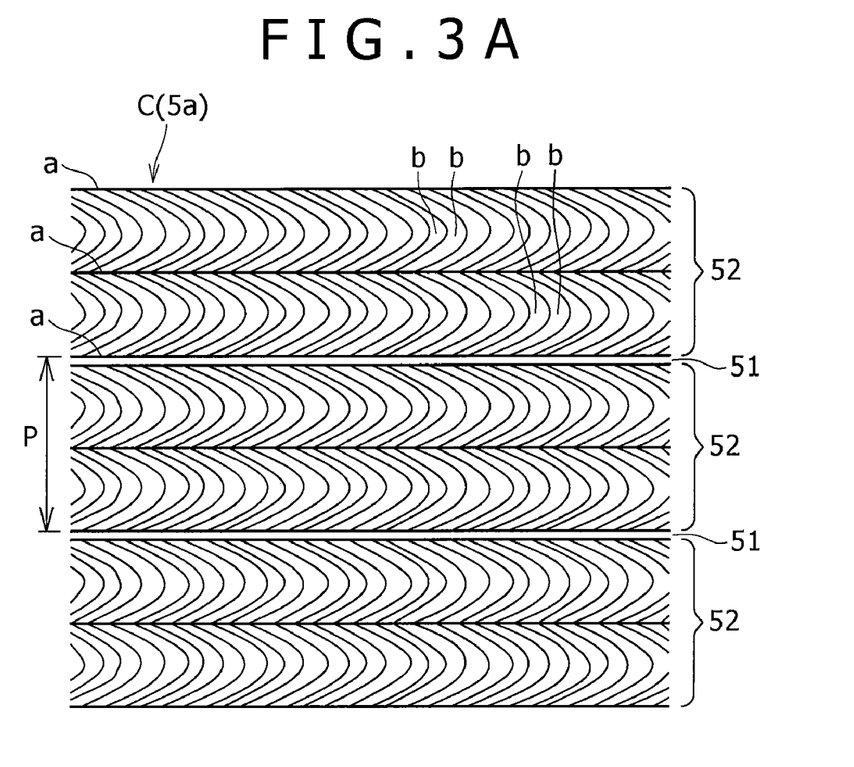
FIGS. 3A and 3B are enlarged plan views showing other examples of the configuration of major part of the thin film semiconductor device according to an embodiment.

The cyclic structure of the channel part C (active region 5a) is not limited to the structure shown in FIG. 2. For example, as shown in FIG. 3A, two rows (or more plural rows) of the crystal grains b each having a crescent shape convex in the extension direction of the crystalline areas 52 may be arranged in each crystalline area 52. In this structure, the successive grain boundary a along the extension direction of the crystalline areas 52 is provided between the rows of the arranged crystal grains b. The crystal grains b having a crescent shape convex in the extension direction of the crystalline areas 52 are arranged between the grain boundaries a-a. Furthermore, this structure is a cyclic structure in which the amorphous area 51 is interposed between the crystalline areas 52-52 each including two or more plural rows of the arranged crystal grains b.

Figure 3B:
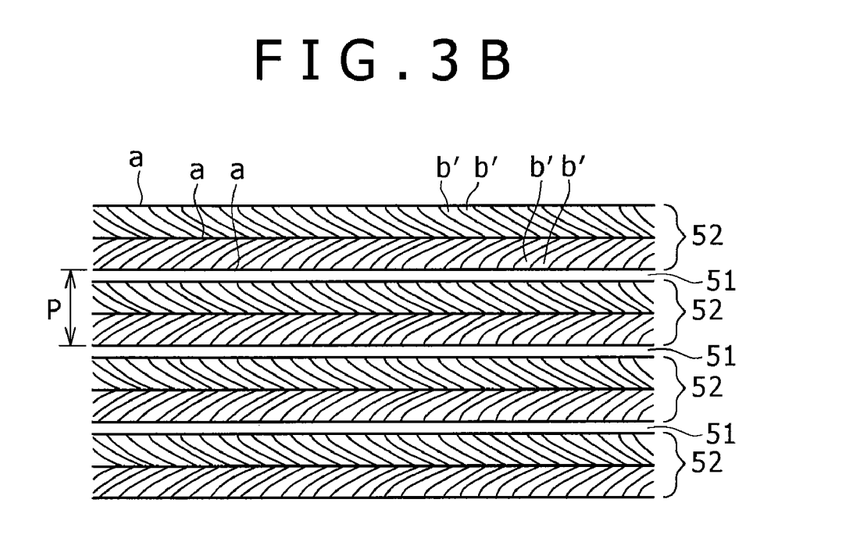

The shape of the crystal grains b arranged in each crystalline area 52 is not limited to a crescent shape. For example, as shown in FIG. 3B, crystal grains b' each having a half-crescent shape arising from division of a crescent shape into the line-symmetry shapes may be arranged. In this structure, in the crystalline area 52, the successive grain boundary a along the extension direction of the crystalline areas 52 is provided between the rows of the arranged crystal grains b'. The half-crescent crystal grains b' each ranging between the grain boundaries a-a are arranged along the extension direction of the crystalline areas 52.

The above-described crescent crystal grains b and half-crescent crystal grains b' are formed by moving an energy beam for scanning in the extension direction of the crystalline areas 52. The forming method will be described in detail in the following explanation of a manufacturing method.

<Method for Manufacturing Thin Film Semiconductor Device>

Based on FIG. 4, a method for manufacturing the thin film semiconductor device 1 having the structure shown in FIGS. 1 and 2 will be described below, also with reference to other drawings according to need. Note that FIGS. 4A to 4D correspond to the section x-x' in FIG. 1A, along the direction of the channel length L.

Figure 4A:
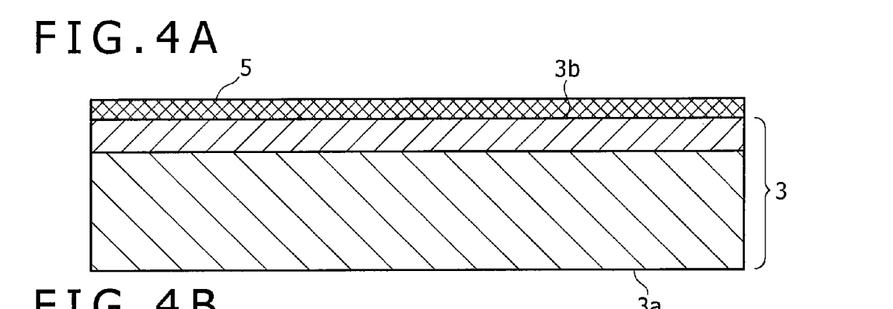
FIGS. 4A to 4D are sectional views for explaining steps in a method for manufacturing a thin film semiconductor device according to an embodiment.

Initially, as shown in FIG. 4A, a substrate 3a over which a thin film semiconductor device is to be formed is prepared. As the substrate 3a, any of amorphous substrates such as a glass substrate, quartz substrate, sapphire substrate, and plastic substrate, and metal substrates such as an aluminum substrate and stainless-steel substrate is used.

On one major surface of the substrate 3a, an insulating buffer layer 3b for preventing thermal conduction to the substrate 3a is provided. As the buffer layer 3b, any of a silicon oxide film, silicon nitride film, silicon carbide film, and other oxide films composed of oxides of Ti, Al, Zr, Hf, and so on may be used. The buffer layer 3b can be formed by a publicly-known vacuum deposition technique such as CVD, sputtering, or evaporation. Alternatively, an insulating layer generally used as an interlayer insulating film and so on, such as an inorganic SOG film or organic SOG film, may be used as the buffer layer. More alternatively, a dielectric film formed through anodic oxidation of a metal film, or a film deposited by a publicly-known technique such as a sol-gel method or metal organic deposition (MOD) may be used.

Subsequently to the deposition of the buffer layer 3b, the amorphous semiconductor thin film 5 is formed over the one main surface of the substrate 3, of which surface has been covered by the buffer layer 3b. In this example, the semiconductor thin film 5 composed of amorphous silicon is formed by plasma enhancement-chemical vapor deposition (PE-CVD) as one example. The thus obtained semiconductor thin film 5 is composed of so-called hydrogenated amorphous silicon (a-Si:H) containing a large amount of hydrogen. The film thickness of the semiconductor thin film 5 is in the range of e.g. 20 nm to 100 nm.

The forming method of the semiconductor thin film 5 is not limited to PE-CVD but a coating method may be used as long as the deposition temperature in the method is low. In a coating method, a mixture of a polysilane compound and a solvent is applied over the substrate 3, and then drying and annealing are carried out to thereby form the semiconductor thin film 5. The use of a deposition method allowing a low deposition temperature, such as PE-CVD or the above-described coating method, provides the semiconductor thin film 5 composed of hydrogenated amorphous silicon (a-Si:H) containing hydrogen of about 0.5 atoms % to 15 atoms %. In any method, this atomic percentage range varies to some extent depending on deposition conditions.

Subsequently to the deposition of the semiconductor thin film 5, so-called dehydrogenation annealing is carried out according to need for desorption of excess hydrogen ions in the semiconductor thin film 5. As the dehydrogenation annealing, e.g. furnace annealing at a temperature of 400° C. to 600° C. is carried out. This dehydrogenation annealing may be omitted if the subsequent crystallization annealing is carried out in such a way that the irradiation energy is so regulated that the excess hydrogen is removed from the part irradiated with laser light without gasification and accompanying expansion of the hydrogen ions in the semiconductor thin film 5.

Figure 4B:
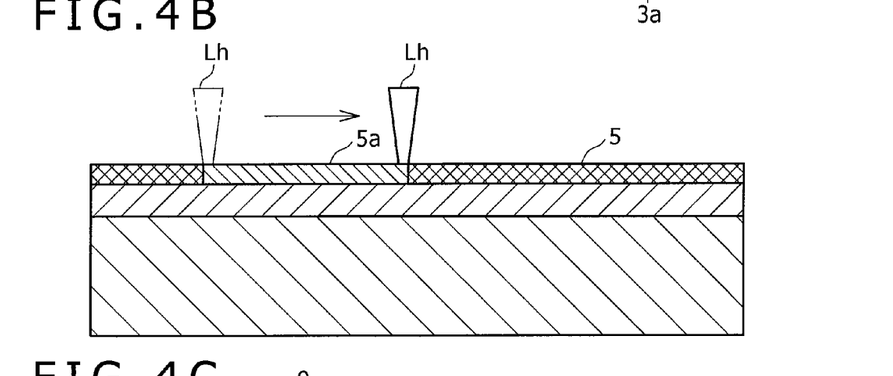

After the above-described step, as shown in FIG. 4B, a crystallization step is carried out to crystallize the active region 5a defined in the semiconductor thin film 5 through irradiation of the semiconductor thin film 5 with laser light Lh as an energy beam.

During the irradiation in this crystallization step, the laser light Lh is moved for scanning in a predetermined direction at a predetermined speed relative to the semiconductor thin film 5.

Figure 5:
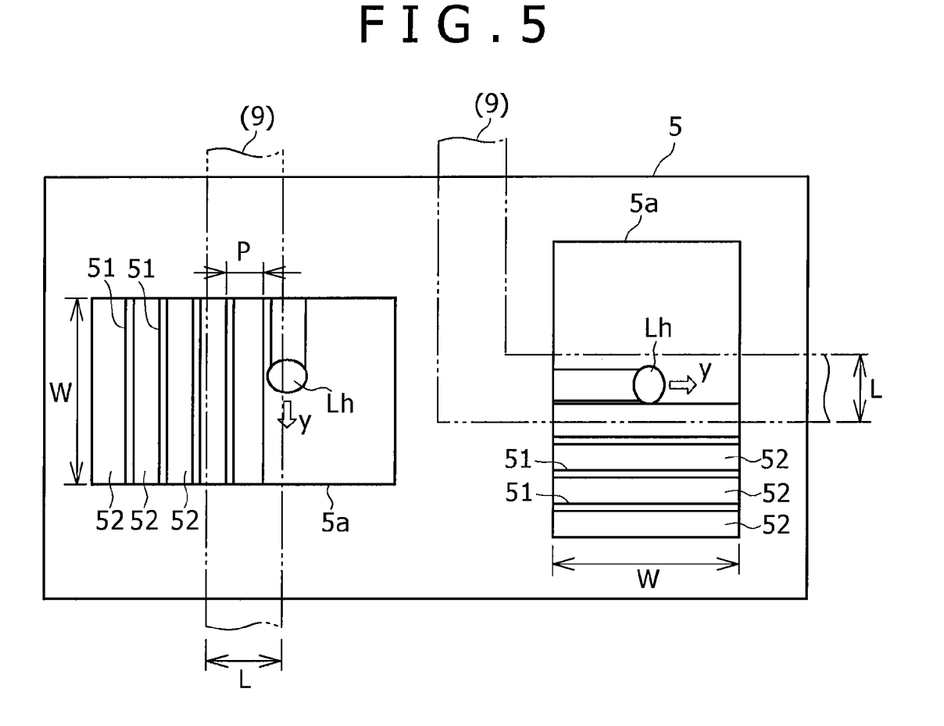
FIG. 5 is a plan view for explaining a crystallization step in the method for manufacturing a thin film semiconductor device according to an embodiment.

Specifically, as shown in FIG. 5, the irradiation position of the laser light Lh is shifted by a predetermined pitch in the width direction of the gate electrode (9) to be formed subsequently (i.e., the direction of the channel length L), so that the laser light Lh is moved for scanning in a predetermined scanning direction y to trace the shifted irradiation position. The scanning direction y of the laser light Lh is set identical to a direction that is substantially the same as the extension direction of the gate electrode (9), i.e., to the direction of the channel width W. Thus, in each active region 5a, the irradiation position of the laser light Lh is shifted in the direction dependent upon the extension direction of the gate electrode (9), so that the laser light Lh is moved for scanning in the predetermined scanning direction y to trace the shifted irradiation position.

Furthermore, in the crystallization step, the irradiation amount, irradiation spot diameter, and scanning speed of the laser light Lh, the shift pitch of the irradiation position, and other parameters are so defined that non-crystallized amorphous regions will be left as the amorphous areas 51 along the scanning direction y of the laser light Lh with a predetermined cycle P.

Figure 6:
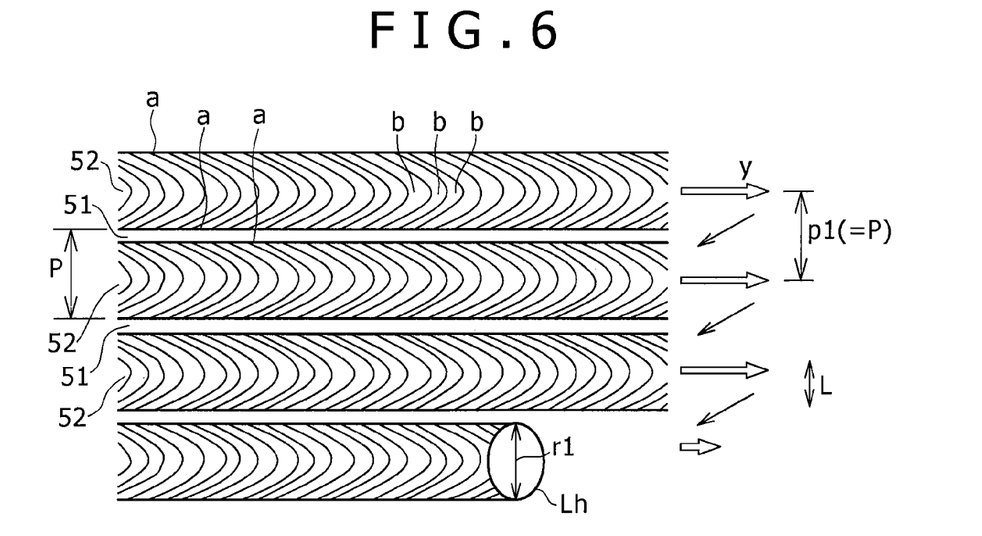
FIG. 6 is a plan view for explaining details of one example of the crystallization step in the method for manufacturing a thin film semiconductor device according to an embodiment.

As an example of the method for the crystallization step, a method employing explosive crystallization like that shown in FIG. 6 is available. To cause the explosive crystallization through irradiation with the laser light Lh, conditions of the irradiation with the laser light Lh, such as the irradiated-region size, irradiation speed, and irradiation energy, are so controlled that during the scanning of the laser light Lh, complete melting of the semiconductor thin film 5 in the irradiated region is preceded by thermal conduction from the irradiated region to the peripheral region.

As the wavelength of the laser light Lh incident on the semiconductor thin film 5, based on the film thickness and absorption coefficient of the semiconductor thin film 5, a wavelength offering a comparatively small absorption coefficient is selected so that the laser light Lh may not pass the semiconductor thin film 5 but be absorbed therein without loss. Specifically, for e.g. the semiconductor thin film 5 composed of amorphous silicon having a thickness of 50 nm, laser light with a wavelength of 350 nm to 470 nm is preferably used. As the oscillation source of the laser light Lh with such a wavelength, e.g. a GaN-based compound semiconductor laser oscillator or a YAG laser oscillator is available. Furthermore, the explosive crystallization of the semiconductor thin film 5 can be caused also by adjusting irradiation conditions other then the wavelength of the laser light Lh, such as the numerical aperture NA of the objective lens that emits the laser light Lh, and the scanning speed and irradiation energy of the laser light Lh.

Across each irradiation position arising from the shift of the laser light Lh with a predetermined shift pitch p1 in the direction of the channel length L, the laser light Lh is moved for scanning in the scanning direction y substantially perpendicular to the direction of the channel length L with the above-described irradiation conditions. In this irradiation, the shift pitch p1 is so adjusted depending on the spot diameter r1 of the laser light Lh that the adjacent irradiation positions of the laser light Lh do not overlap with each other but the amorphous area 51 with a predetermined width is left between the adjacent irradiation positions.

Due to this, polycrystallization of the semiconductor thin film 5 proceeds in such a way that the amorphous areas 51 are provided with the cycle P having the same width as the shift pitch p1. Formed between the amorphous areas 51-51 is the crystalline area 52 in which the crystal grains b each having a crescent shape convex in the scanning direction y of the laser light Lh are arranged along the extension direction of the amorphous areas 51.

The spot diameter r1 of the laser light Lh and the shift pitch p1 of the irradiation position of the laser light Lh (the repetition cycle P of the amorphous areas 51) are important factors in defining the number of amorphous areas 51 (the number of cycles) provided in the channel part. As described above in the explanation of the device structure, the number of amorphous areas 51 (the number of cycles) provided in the channel part is set to a large value that allows uniformed transistor characteristics without lowering of carrier mobility. In addition, the shift pitch p1 (the cycle P of the amorphous areas 51) is so defined that a larger number of amorphous areas 51 are provided in the channel part without excess over the process tact time. Furthermore, depending on the shift pitch p1, the spot diameter r1 of the laser light Lh is so defined that the amorphous areas 51 having as small a predetermined width as possible will be left.

As a crystallization step other than the above-described crystallization step, the crystallization shown in FIG. 3A is described below. Specifically, due to this crystallization, the crystalline areas 52 each including plural rows (e.g., two rows) of the crystal grains b having a crescent shape are formed. In this crystallization step, after the first scanning of the laser light Lh in the scanning direction y, the irradiation position of the laser light Lh is shifted in the direction of the channel length L by a first predetermined pitch that allows partial overlapping of the before-shift and after-shift irradiation positions. After the shift, the second scanning of the laser light Lh in the scanning direction y is carried out across the shifted irradiation position. This forms the crystal grains b on the second row, with no amorphous region left, and with formation of the successive grain boundary a along the scanning direction y between the crystal grains b on the second row and the crystal grains b arising from the first scanning. Thus, the crystalline area 52 in which the grains b having a crescent shape are arranged on the rows on both the sides of the grain boundary a is formed. Thereafter, the irradiation position of the laser light Lh is shifted in the direction of the channel length L by a second predetermined pitch that prevents partial overlapping of the before-shift and after-shift irradiation positions and hence leaves the amorphous area 51 having a predetermined width. After the shift, the first scanning of the laser light Lh in the scanning direction y is carried out across the shifted irradiation position. From then on, the above-described first and second scanning of the laser light Lh are repeated with the first and second predetermined pitches fixed. If three or more plural rows of the crystal grains b having a crescent shape are to be arranged in each crystalline area 52, the following crystallization is carried out. Specifically, after the second scanning of the laser light Lh subsequent to the shift of the irradiation position by the first predetermined pitch, the third (and more) scanning of the laser light is carried out after the irradiation position is further shifted by the first predetermined pitch. Thereafter, the first scanning of the laser light Lh is carried out, followed by repetition of the second scanning and subsequent scanning.

Alternatively, in the case of forming between the amorphous areas 51-51 the crystalline area 52 shown in FIG. 3B, which includes the crystal grains b' that each have a half-crescent shape and are arranged on rows on both the sides of the grain boundary a, irradiation conditions of the laser light Lh are so defined that the semiconductor thin film 5 is completely melted across the depth thereof due to scanning of the laser light Lh.

For the complete melting of the semiconductor thin film 5 across the depth thereof, irradiation conditions such as the wavelength of the laser light Lh, the numerical aperture NA of the objective lens that emits the laser light Lh, and the scanning speed and irradiation energy of the laser light Lh are adjusted based on the film thickness and absorption coefficient of the semiconductor thin film 5. Similarly to the above-described explosive crystallization, the crystallization shown in FIG. 3B can also employ the laser light Lh having a wavelength of 350 nm to 470 nm, emitted from a GaN-based compound semiconductor laser oscillator or YAG laser oscillator. In this crystallization, the semiconductor thin film 5 is completely melted across the depth thereof through adjustment of the above-described irradiation conditions.

Figure 7:
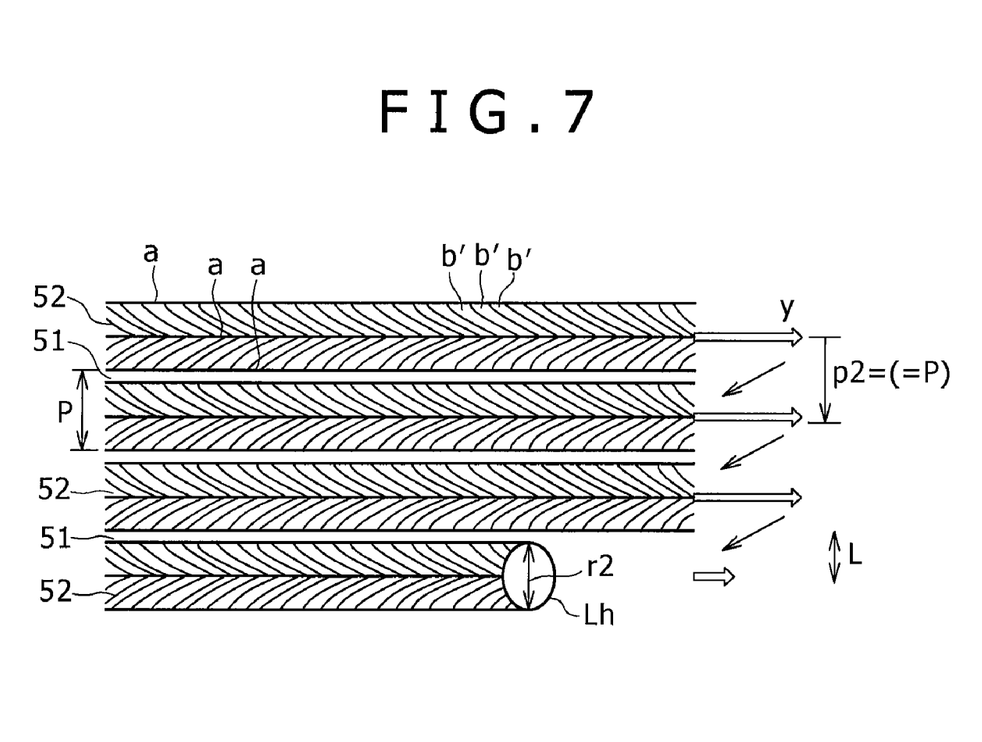
FIG. 7 is a plan view for explaining details of another example of the crystallization step in the method for manufacturing a thin film semiconductor device according to an embodiment.

In this crystallization, as shown in FIG. 7, across each irradiation position arising from the shift of the laser light Lh by a predetermined shift pitch p2 in the direction of the channel length L, the laser light Lh is moved for scanning in the scanning direction y (the extension direction of the gate electrode) substantially perpendicular to the direction of the channel length L. Furthermore, the shift pitch p2 of the laser light Lh is so adjusted depending on the spot diameter r2 of the laser light Lh (in the direction of the channel length L) that the amorphous area 51 will be left between the adjacent irradiation positions of the laser light Lh.

Moreover, due to the adjustment of irradiation conditions for completely melting the semiconductor thin film 5 across the depth thereof, the crystallization proceeds in such a way that the successive grain boundary a is formed at the scan center of the laser light Lh along the scanning direction y. This results in formation of the crystalline area 52 in which the crystal grains b' each having a half-crescent shape are arranged on rows on both the sides of the grain boundary a along the extension direction of the amorphous areas 51. Furthermore, the successive grain boundaries a along the extension direction of the crystalline area 52 are formed also at the edges of the crystalline area 52. This results in the state in which the half-crescent crystal grains b' are arranged between the grain boundaries a-a. This crystallization step can offer a favorable crystal quality and hence enhanced carrier mobility because the crystal grains b' are obtained through complete melting of the semiconductor thin film 5 by irradiation with the laser light Lh and subsequent recrystallization through liquid-phase growth.

Also in this crystallization, the spot diameter r2 of the laser light Lh and the shift pitch p2 of the irradiation position of the laser light Lh (the cycle P of the amorphous areas 51) are so defined that a larger number of amorphous areas 51 are provided in the channel part without excess over the process tact time, similarly to the explosive crystallization described with FIG. 6.

Furthermore, in the case of forming crystalline areas each including the crystal grains b' that have a half-crescent shape and are arranged on an even number of rows equal to or larger than four rows, the following steps are repeatedly carried out with a predetermined cycle: the step of shifting the irradiation position of the laser light Lh in the direction of the channel length L by a first predetermined pitch that allows partial overlapping of the before-shift and after-shift irradiation positions, and then moving the laser light Lh for scanning in the scanning direction y across the shifted irradiation position; and the step of shifting the irradiation position of the laser light Lh in the direction of the channel length L by a second predetermined pitch that prevents partial overlapping of the before-shift and after-shift irradiation positions, and then carrying out the first scanning of the laser light Lh in the scanning direction y across the shifted irradiation position. During the scanning of the laser light Lh in the scanning direction y across the irradiation position resulting from the shift by the first predetermined pitch that allows partial overlapping of the irradiation positions, crystallization proceeds in such a way that the crystallinity of the adjacent crystal grains b' formed in the previous scanning is carried over. Therefore, the half-crescent grains b' on the center two rows in the crystalline area coalesce with each other to form crystal grains each having a crescent shape.

In the above-described respective crystallization steps described with FIGS. 6 and 7, it is important that the width of the amorphous areas 51 formed through irradiation with the laser light Lh is kept constant and the characteristics of the grain boundaries a are also kept constant. As factors in keeping them constant, the following conditions should be satisfied: the laser irradiation energy density is constant across each irradiation position; the scanning speed is constant; the shift pitches p1 and p2 of the irradiation position are constant (the cycle P is constant); and the film thickness of the semiconductor thin film 5 is uniform.

To obtain a constant density of the irradiation energy of the laser light Lh, it is desirable that the laser light Lh be continuously oscillated at least during irradiation of the active region 5a with the laser light Lh. The "continuous oscillation" encompasses also an oscillation pause that does not lead to a decrease in the temperature of the semiconductor thin film 5 (e.g., a pause of 50 ns or shorter). In addition, to carry out the above-described irradiation with a constant density of the irradiation energy of the laser light Lh, it is desirable to use a laser light irradiation apparatus equipped with an energy feedback function and a focus servo function. The energy feedback function and focus servo function can be implemented by a publicly-known technique used in e.g. a cutting machine for optical discs.

The irradiation of the semiconductor thin film 5 with the laser light Lh is carried out in such a way that the scanning speed of the laser irradiation is kept constant.

The shift of the irradiation position of the laser light may be relative to the semiconductor thin film; the substrate over which the semiconductor thin film has been formed may be shifted relative to the fixed irradiation position, or alternatively the irradiation position may be shifted relative to the fixed substrate. More alternatively, both the substrate 3 and the irradiation position may be moved.

Furthermore, the parallel scanning of the laser light Lh in the above-described crystallization step may be sequentially carried out with use of one laser oscillator, or alternatively may be collectively carried out with use of plural laser oscillators. In fabrication of thin film transistors for driving a display, it is preferable that the plural active regions be simultaneously irradiated. Specifically, when the productivity is taken into consideration, it is preferable that the plural active regions arranged over a surface of the substrate 3 be simultaneously subjected to multipoint irradiation with the laser light Lh so that a crystallization step can be carried out for the plural active regions simultaneously.

To realize such multipoint irradiation with the laser light Lh, a semiconductor laser oscillator is preferably used as the oscillation source of the laser light. The semiconductor laser oscillator is greatly smaller in size than other laser oscillators such as excimer laser oscillators and YAG laser oscillators, which permits plural semiconductor laser oscillators to be disposed in one apparatus. Furthermore, the semiconductor laser oscillator can realize continuous irradiation with a rated output of 40 mW.

If the semiconductor laser oscillators are used, the number of semiconductor lasers can be increased in association with an increase in the substrate size. Hence, flexible apparatus design to address the substrate size increase is possible. Thus, a structure in which a large number of transistors having the same performance are arranged over a large-area substrate can be obtained. Therefore, using the semiconductor laser oscillators is advantageous, in forming of transistors having uniform characteristics over a large-area substrate, over a method of controlling grain boundaries with use of a mask, reported at a research level.

Figure 4C:
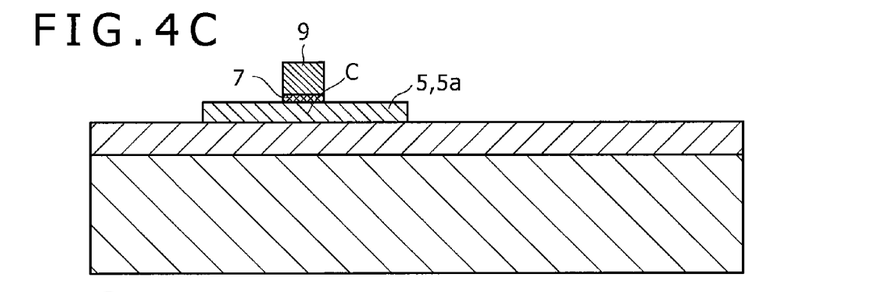

After the completion of the above-described crystallization step, as shown in FIG. 4C, the semiconductor thin film 5 is patterned by etching into a predetermined shape in which the crystallized active region 5a is left, so that the respective active regions 5a are shaped into an island for element isolation. The pattern-etching of the semiconductor thin film 5 may be so carried out that no non-crystallized semiconductor thin film 5 is left around the active region 5a as shown in the drawing. Alternatively, the non-crystallized semiconductor thin film 5 may be left around the active region 5a. This pattern-etching of the semiconductor thin film 5 may precede the above-described crystallization step. In this case, the crystallization step is carried out for each semiconductor thin film 5 patterned into an island including the region that is to serve as the active region 5a.

Subsequently to the pattern-etching, a gate insulating film 7 is formed above the substrate 3 to cover a part of the active region 5a resulting from the patterning. The gate insulating film 7 is formed of a silicon oxide or silicon nitride, and can be deposited by a publicly-known method based on general PE-CVD. Alternatively, a publicly-known SOG film may be deposited as an insulating layer arising from coating. The deposition of the gate insulating film 7 may precede the pattern-etching of the semiconductor thin film 5.

The deposition of the gate insulating film 7 is followed by forming of the gate electrode 9 thereon. The gate electrode 9 traverses the center of the active region 5a shaped into an island. Specifically, as described with FIG. 5, the gate electrode 9 is formed along the extension direction of the amorphous areas 51 and the crystalline areas 52 formed in the active region 5a. That is, the gate electrode is formed along the direction along which areas each having a substantially same crystalline state extend. If elements having the same characteristics are to be formed, the gate electrodes 9 having the same line width are pattern-formed for the elements so that the amorphous areas 51 and the crystalline areas 52 are disposed below the gate electrodes 9 with the same number of cycles.

To form the gate electrode 9, initially an electrode material layer composed of e.g. aluminum is deposited by sputtering or evaporation, and then a resist pattern is formed on the electrode material layer by lithography. Thereafter, the electrode material layer is etched by using the resist pattern as the mask, so that the gate electrode 9 is pattern-formed.

The forming method of the gate electrode 9 is not limited to this procedure, but e.g. a printing method of applying metal fine particles may be employed. Continuously to the etching of the electrode material layer for the forming of the gate electrode 9, the gate insulating film 7 may also be etched.

Figure 4D:
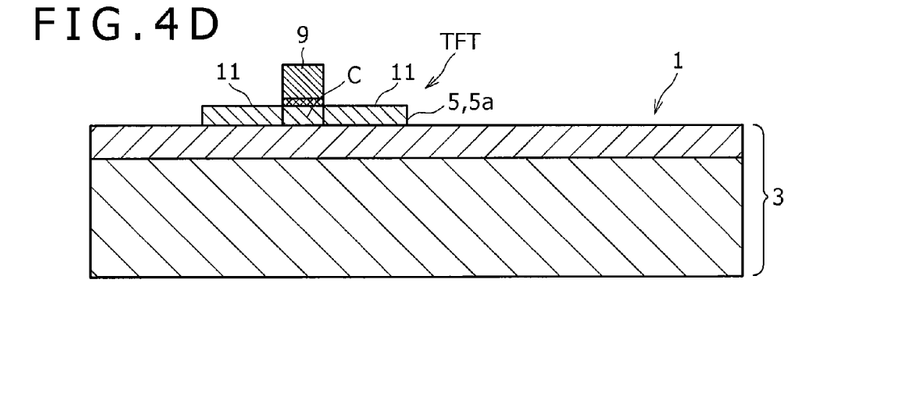

Subsequently to the forming of the gate electrode 9, as shown in FIG. 4D, the source/drain 11 are formed by introducing an impurity into the active region 5a in a self-aligned manner by using the gate electrode 9 as the mask. For this impurity introduction, e.g. ion-implantation with use of the gate electrode 9 as the mask is carried out.

This impurity introduction forms the channel part C below the gate electrode 9. The channel part C corresponds to a region not doped with the impurity in the crystallized active region 5a. In these source/drain 11 and the channel part C below the gate electrode 9, crystalline areas composed of polycrystalline silicon obtained by crystallizing the semiconductor thin film 5 are arranged. Therefore, the completion of the above-described steps results in achievement of the thin film semiconductor device 1 in which plural top-gate thin film transistors TFT (i.e., poly-Si TFTs) formed of a poly-Si thin film are provided over the same substrate 3.

If, for example, a liquid crystal display is to be manufactured as a display employing such thin film transistors TFT as its switching elements, the following steps are further carried out.

Figure 8A:
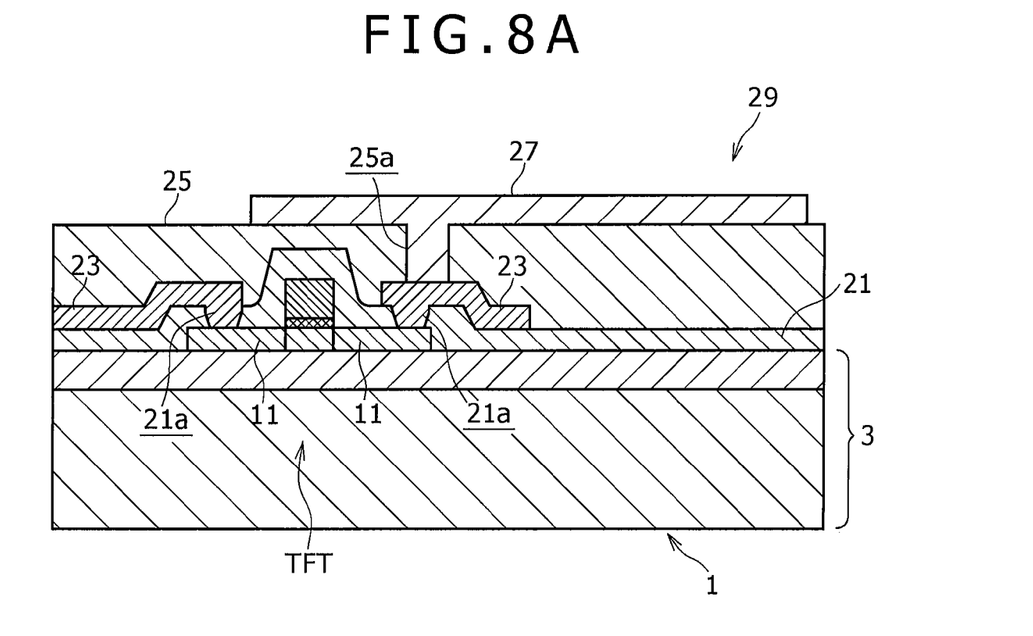
FIGS. 8A and 8B are diagrams showing manufacturing steps for a liquid crystal display employing the thin film semiconductor device according to an embodiment.

Referring initially to FIG. 8A, over the substrate 3 of the thin film semiconductor device 1, an interlayer insulating film 21 is formed to cover the thin film transistor TFT. Subsequently, contact holes 21a that reach the source/drain 11 of the thin film transistor TFT are formed in the interlayer insulating film 21. Next, interconnects 23 coupled to the source/drain 11 via the contact holes 21a are formed on the interlayer insulating film 21.

Subsequently, a planarization insulating film 25 is formed to cover the interconnects 23, and a contact hole 25a that reaches the interconnect 23 is formed in the planarization insulating film 25. Next, a pixel electrode 27 connected to the source/drain 11 via the contact hole 25a and the interconnect 23 is formed on the planarization insulating film 25. The pixel electrode 27 is formed as a transparent electrode or reflective electrode depending on the displaying type of the liquid crystal display. Note that this drawing is a sectional view of major part of one pixel.

After the forming of the pixel electrode 27, an alignment layer (not shown) that covers the pixel electrode 27 is formed on the planarization insulating film, to thereby complete a drive substrate 29.

Figure 8B:
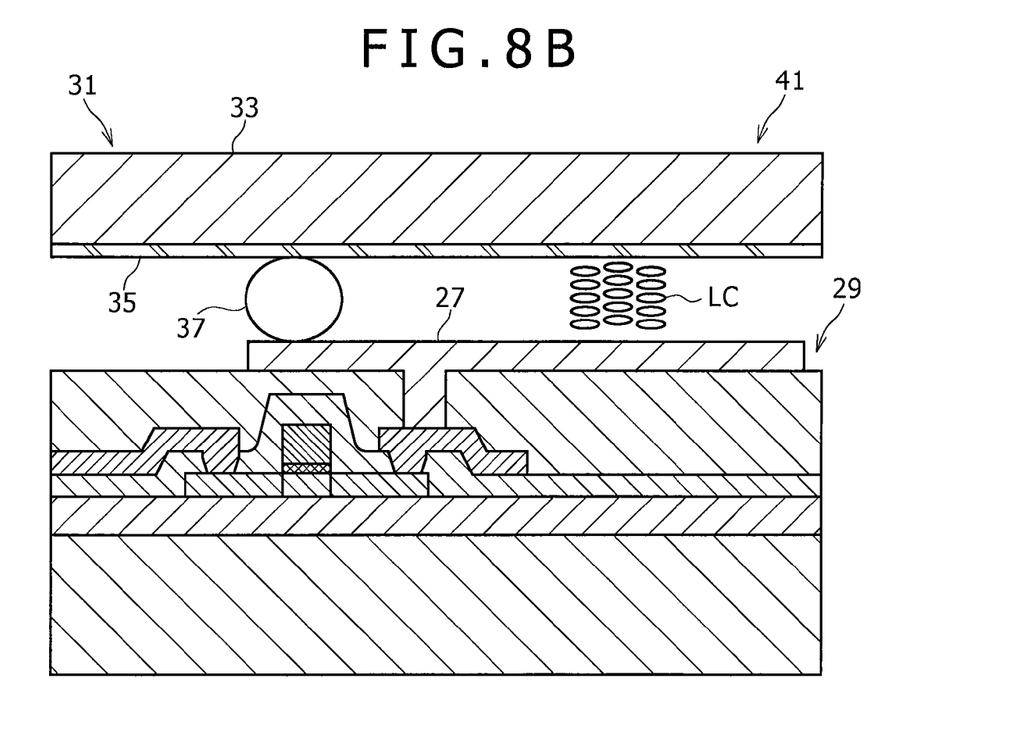

Furthermore, as shown in FIG. 8B, a counter substrate 31 that is to be disposed to face the drive substrate 29 is prepared. The counter substrate 31 is obtained by providing a common electrode 35 on a transparent substrate 33 and covering the common electrode 35 with an alignment layer (not shown). The common electrode 35 is formed of a transparent electrode.

The drive substrate 29 and the counter substrate 31 are disposed to face each other with intermediary of a spacer 37 therebetween in such a way that the pixel electrode 27 faces the common electrode 35. Subsequently, a liquid crystal LC is disposed and sealed between the substrates 29 and 31, separated by a predetermined gap by the spacer 37, so that a liquid crystal display 41 is completed.

If an organic EL display is to be manufactured by using the drive substrate 29 having the above-described configuration, the pixel electrode provided on the drive substrate 29 is used as an anode (or cathode), and organic layers with requisite functions such as a hole injection layer, luminescent layer, and electron transport layer are deposited over the pixel electrode. Furthermore, a common electrode is formed as a cathode (or anode) over the organic layers.

Referring to FIGS. 1A and 1B and 2, in the thin film semiconductor device 1 of the present embodiment, the amorphous areas 51 and the crystalline areas 52 provided along the gate electrode 9 traverse the channel part C and are disposed cyclically in the direction of the channel length L. Due to this structure, carriers that are to pass the channel part C necessarily traverse the cyclically disposed amorphous areas 51. Therefore, adjusting the cycle P of the amorphous areas 51 can control transistor characteristics (carrier mobility) of the thin film transistors TFT in the thin film semiconductor device 1 with high accuracy. Specifically, variation in carrier mobility among plural elements can be suppressed by equalizing the following factors: the cycle P, the number of amorphous areas 51 disposed in the channel part C, the total sum of the widths of the amorphous areas 51, and the crystalline state of the crystalline areas 52.

In addition, also when the grain boundaries a are provided in the crystalline areas 52 as shown in FIG. 3, adjusting the cycle of the grain boundaries a as the cycle P can control transistor characteristics (carrier mobility) of the thin film transistors TFT in the thin film semiconductor device 1 with high accuracy.

Moreover, the cycle P (encompassing the cycle of the grain boundaries a) can be favorably controlled by adjusting irradiation conditions of the laser light Lh as described above, which makes it possible to form the thin film transistors TFT of which transistor characteristics are controlled with high accuracy.

In particular, when the crystal grains b each ranging across the width of the crystalline area 52 are arranged in the crystalline area 52 as shown in FIG. 2, the carrier mobility in the direction of the channel length L can be kept high because carriers do not pass the grain boundary between the grains b-b in the crystalline area 52.

Consequently, a display having enhanced performance can be obtained by constructing the display with use of the thin film transistors TFT formed in such a thin film semiconductor device as switching elements for pixels. In an organic EL display in particular, color unevenness in the display part can be significantly reduced.

In the above-described embodiment, the amorphous areas 51 and the crystalline areas 52 are cyclically provided in the channel part C of the active region 5a. However, as long as the crystalline state in the channel part C changes cyclically in the direction of the channel length L and areas each having a substantially same crystalline state traverse the channel part C, an embodiment can control transistor characteristics with high accuracy through adjustment of the cycle of the crystalline state, to thereby achieve the thin film transistors TFT of which characteristic variation is small. Other examples of such a cyclic structure include a structure in which the amorphous areas 51 traversing the channel part C are not provided but only the crystal grain size is cyclically changed in the direction of the channel length L. Moreover, another structure example in which the impurity segregation state is changed in association with the cyclic grain size change is also available.

In addition, in the above-described embodiment, polycrystallization in which the crystalline state is cyclically changed as described above is carried out through the crystallization step in which laser light is moved for scanning in a predetermined scanning direction across each irradiation position arising from shift by a predetermined shift pitch. However, the crystallization step for carrying out polycrystallization in which the crystalline state is cyclically changed is not limited to the above-described method.

For example, a method is also available in which a semiconductor thin film is irradiated with pulses of laser light shaped into a line in such a way that the laser light is shifted by a cycle P in the minor axis direction of the line shape at every pulse irradiation. Also by this method, overlapping only parts of adjacent irradiation positions with each other can form an active region in which the crystalline state is different between the part irradiated with the laser light redundantly and the other part and therefore a cyclic change of the crystalline state is achieved. In this method, by setting the minor axis direction of the line shape to the direction of the channel length L, the direction of the cyclic change of the crystalline state is set to the direction of the channel length L.

Moreover, the beam profile of laser light may be set to a Gaussian curve so that a difference in crystallization may arise between the region on which the center part of the laser light has passed and the region on which the peripheral part thereof has passed.

Working Examples 1 to 3 in accordance with an embodiment is described below based on FIGS. 4A to 7 and other requisite drawings, and then a comparative example is described.

WORKING EXAMPLES 1-1 AND 1-2

Plural thin film transistors were formed by employing the crystallization step described with FIG. 6 (see FIGS. 1A and 1B).

Specifically, initially the semiconductor thin film 5 composed of amorphous silicon was deposited to a film thickness of 50 nm by PE-CVD over the insulating substrate 3.

Subsequently, annealing treatment in which each active region 5a of the semiconductor thin film 5 is irradiated with the laser light Lh for polycrystallization thereof was carried out. A GaN laser was used as the laser light Lh, and the spot shape thereof was set to the following eclipse shape: the spot diameter r1 in the direction of the channel length L was 500 nm, and the spot diameter in the direction y perpendicular to the direction of the channel length L was 300 nm. The effective numerical aperture NA of an objective lens was 0.6. In the crystallization step for the semiconductor thin film 5, the shift pitch p1 in the direction of the channel length L was 500 nm, and the scanning speed vt in the scanning direction y perpendicular to the direction of the channel length L was 3 m/s. The irradiation energy at the substrate surface (plate-surface irradiation energy) was 17 mW. Focus servo was performed on the irradiation of the semiconductor thin film 5 with the laser light Lh so that the focus was not deviated at the time of the high-speed scanning. Furthermore, a part of the emitted beam was monitored so that the irradiation energy was kept constant, to thereby significantly reduce variation in the energy.

This crystallization step resulted in formation of the active region 5a in which the crystalline areas 52 having a width of 490 m were provided cyclically in the direction of the channel length L in such a way that the amorphous area 51 having a width of 10 nm was interposed between the crystalline areas 52 with a cycle P of 500 nm. In each crystalline area 52, the crescent-shape crystal grains b that ranged across the width of the crystalline area 52 and were convex in the scanning direction y were arranged. As the size of each grain b, the maximum width thereof in the scanning direction y (the width of "belly part" of the crescent) was about 100 nm.

Subsequently to the crystallization step, each crystallized active region 5a was so patterned that the width thereof in the extension direction of the amorphous areas 51 (i.e., the channel width W) was set to 50 μm. Thereafter, the gate insulating film 7 was deposited to cover the patterned active region 5a, and then the gate electrode 9 was formed over the gate insulating film 7 along the extension direction of the amorphous areas 51. As shown in Table 1, the line width of the gate electrode 9 (i.e., the channel length L) was 5 μm and 20 μm in Working Examples 1-1 and 1-2, respectively. Therefore, the number of the amorphous areas 51 that were provided under the gate electrode 9 to traverse the active region 5a was about 10 and 40, respectively.

TABLE 1

| | Channel Length L | Channel Width W | The Number of Crystalline-state Cycles (The Number of Amorphous Areas) | Variation in On-state Current ±σ | Mobility (cm$^2$/Vs) |
|---|---|---|---|---|---|
| Working Example 1-1 | 5 μm | 50 μm | 10 | ±1.9% | 14 |
| Working Example 1-2 | 20 μm | | 40 | ±1.4% | 10 |

Type of FIG. 6: GaN laser, NA=0.6, the cycle P of the crystalline state is 500 nm Thereafter, the source/drain 11 were formed in the active region 5a on both the sides of the gate electrode 9, so that the plural thin film transistors TFT having the same standards were formed over the substrate 3 in each of Working Examples 1-1 and 1-2.

The variation ±σ in the on-current state among the fabricated thin film transistors TFT was measured. The result is also shown in Table 1. The result shows that a larger number of amorphous areas 51 (a larger number of cycles) offers thin film transistors of which variation ±σ in the on-state current is smaller and hence of which characteristic accuracy is more favorable. In particular, the result on the thin film transistors with a channel length L of 20 μm shows the following feature. Specifically, if the number of amorphous areas 51 (the number of cycles) is at least 40, the variation ±σ in the on-state current can be suppressed to a value within the range of ±1.4%. Therefore, even when these thin film transistors are used as switching elements for pixel electrodes in a display employing organic electro-luminescence elements, luminance variation can be sufficiently suppressed to such an extent that the variation is not visually recognized. Furthermore, the FET mobility (carrier mobility) of the thin film transistors was 10 cm$^2$/Vs. Thus, it has also been confirmed that a sufficiently favorable transistor characteristic can be achieved as a characteristic of pixel switches.

WORKING EXAMPLES 2-1 AND 2-2

Plural thin film transistors were formed by employing the crystallization step described with FIG. 7 (see FIG. 1).

Specifically, initially the semiconductor thin film 5 composed of amorphous silicon was deposited to a film thickness of 50 nm by PE-CVD over the insulating substrate 3.

Subsequently, annealing treatment in which each active region 5a of the semiconductor thin film 5 is irradiated with the laser light Lh for polycrystallization thereof was carried out. A GaN laser was used as the laser light Lh, and the spot shape thereof was set to a circular shape of which spot diameter r2 in the direction of the channel length L was 500 nm. The effective numerical aperture NA of an objective lens was 0.8. In the crystallization step for the semiconductor thin film 5, the shift pitch p2 in the direction of the channel length L was 500 nm, and the scanning speed vt in the scanning direction y perpendicular to the direction of the channel length L was 1 m/s. The plate-surface irradiation energy was 12 mW. Similar to Working Examples 1-1 and 1-2, focus servo was performed and a part of the emitted beam was monitored during the irradiation of the semiconductor thin film 5 with the laser light Lh.

This crystallization step resulted in formation of the active region 5a in which the crystalline areas 52 having a width of 490 nm were provided cyclically in the direction of the channel length L in such a way that the amorphous area 51 having a width of 10 nm was interposed between the crystalline areas 52 with a cycle P of 500 nm. In each crystalline area 52, the crystal grains b' each having a half-crescent shape were arranged along the extension direction of the crystalline areas 52, with the grain boundary a interposed therebetween. As the size of each grain b', the maximum width thereof in the scanning direction y was about 150 nm.

Subsequent to the crystallization step, in a manner similar to Working Examples 1-1 and 1-2, the active region 5a was so patterned that the width thereof in the extension direction of the amorphous areas 51 (i.e., the channel width W) was set to 50 μm. Subsequently, the gate electrode 9 was formed with intermediary of the gate insulating film 7. As shown in Table 2, the line width of the gate electrode 9 (i.e., the channel length L) was 5 μm and 20 μm in Working Examples 2-1 and 2-2, respectively. Therefore, the number of amorphous areas 51 that were provided under the gate electrode 9 to traverse the active region 5a was 10 and 40 in Working Examples 2-1 and 2-2, respectively.

TABLE 2

| | Channel Length L | Channel Width W | The Number of Crystalline-state Cycles (The Number of Amorphous Areas) | Variation in On-state Current ±σ | Mobility (cm$^2$/Vs) |
|---|---|---|---|---|---|
| Working Example 2-1 | 5 μm | 50 μm | 10 | ±1.9% | 18 |
| Working Example 2-2 | 20 μm | | 40 | ±1.3% | 12 |

Type of FIG. 7: GaN laser, NA=0.8, the cycle P of the crystalline state is 500 nm Thereafter, the source/drain 11 were formed in the active region 5a on both the sides of the gate electrode 9, so that the plural thin film transistors TFT having the same standards were formed over the substrate 3 in each of Working Examples 2-1 and 2-2.

The variation ±σ in the on-current state among the fabricated thin film transistors TFT was measured. The result is also shown in Table 2. The result shows that a larger number of amorphous areas 51 (a larger number of cycles) offers thin film transistors of which variation ±σ in the on-state current is smaller and hence of which characteristic accuracy is more favorable. In particular, the result on the thin film transistors with a channel length L of 20 μm shows the following feature. Specifically, if the number of amorphous areas 51 (the number of cycles) is at least 40, the variation ±σ in the on-state current can be suppressed to a value within the range of ±1.3%. Therefore, even when these thin film transistors are used as switching elements for pixel electrodes in a display employing organic electro-luminescence elements, luminance variation can be sufficiently suppressed to such an extent that the variation is not visibly recognized. Furthermore, the FET mobility (carrier mobility) of the thin film transistors was 12 cm$^2$/Vs. Thus, it has also been confirmed that a sufficiently favorable transistor characteristic can be achieved as a characteristic of pixel switches.

WORKING EXAMPLES 3-1 AND 3-2

Similarly to Working Examples 2-1 and 2-2, plural thin film transistors were formed by employing the crystallization step described with FIG. 7 (see FIGS. 1A and 1B).

Specifically, in Working Examples 3-1 and 3-2, the crystallization step was carried out in the same manner as Working Examples 2-1 and 2-2, except that the irradiation conditions of the laser light Lh were different as follows: the effective numerical aperture NA of an objective lens was 0.4, and the pitch p2 was 600 nm.

This crystallization step resulted in formation of the active region 5a in which the crystalline areas 52 having a width of 590 nm were provided cyclically in the direction of the channel length L in such a way that the amorphous area 51 having a width of 10 nm was interposed between the crystalline areas 52 with a cycle P of 600 nm. In each crystalline area 52, the crystal grains b' each having a half-crescent shape were arranged along the extension direction of the crystalline areas 52, with the grain boundary a interposed therebetween. As the size of each grain b', the maximum width thereof in the scanning direction y was about 150 nm.

Subsequent to the crystallization step, in a manner similar to Working Examples 1-1 and 1-2, the active region 5a was so patterned that the width thereof in the extension direction of the amorphous areas 51 (i.e., the channel width W) was set to 50 μm. Subsequently, the gate electrode 9 was formed with intermediary of the gate insulating film 7. As shown in Table 3, the line width of the gate electrode 9 (i.e., the channel length L) was 5 μm and 20 μm in Working Examples 3-1 and 3-2, respectively. Therefore, the number of amorphous areas 51 that were provided under the gate electrode 9 to traverse the active region 5a was about 8 and about 33 in Working Examples 3-1 and 3-2, respectively.

TABLE 3

| | Channel Length L | Channel Width W | The Number of Crystalline-state Cycles (The Number of Amorphous Areas) | Variation in On-state Current ±σ | Mobility (cm$^2$/Vs) |
|---|---|---|---|---|---|
| Working Example 3-1 | 5 μm | 50 μm | 8 | ±1.0% | 15 |
| Working Example 3-2 | 20 μm | | 33 | ±0.6% | 10 |

Type of FIG. 7: GaN laser, NA=0.4, the cycle P of the crystalline state is 600 nm (a process improvement is reflected in these results)

Thereafter, the source/drain 11 were formed in the active region 5a on both the sides of the gate electrode 9, so that the plural thin film transistors TFT having the same standards were formed over the substrate 3 in each of Working Examples 3-1 and 3-2.

The variation ±σ in the on-current state among the fabricated thin film transistors TFT was measured. The result is also shown in Table 3. The result shows that a larger number of amorphous areas 51 (a larger number of cycles) offers thin film transistors of which variation ±σ in the on-state current is smaller and hence of which characteristic accuracy is more favorable. Furthermore, the result on the thin film transistors with a channel length L of 5 μm shows the following feature. Specifically, even if the number of amorphous areas 51 (the number of cycles) is as low as about 8, the variation ±σ in the on-state current can be suppressed to a value within the range of ±1.0%. Therefore, even when these thin film transistors are used as switching elements for pixel electrodes in a display employing organic electro-luminescence elements, luminance variation can be sufficiently suppressed to such an extent that the variation is not visibly recognized. Furthermore, the FET mobility (carrier mobility) of the thin film transistors was 15 cm$^2$/Vs. Thus, it has also been confirmed that a sufficiently favorable transistor characteristic can be achieved as a characteristic of pixel switches.

COMPARATIVE EXAMPLE

Plural thin film transistors were formed by employing a crystallization step with use of an excimer laser based on an existing configuration.

Specifically, initially the same semiconductor thin film 5 as that in Working Examples 1-1 and 1-2 was deposited. Subsequently, the semiconductor thin film 5 was irradiated with pulses of a KrF excimer laser processed into a line beam of which width in the optical minor axis direction thereof was 400 μm. In this irradiation step, the irradiation position was shifted by a pitch of 8 μm in the minor axis direction for every pulse so that most parts of the respective irradiated regions overlapped with each other. The energy profile of the line beam, evaluated on a section parallel to the minor axis, was set to a top-hat shape (trapezoidal shape). Due to this irradiation condition, the same region was irradiated with about 50 shots of the pulse laser. The irradiation period of one pulse of the laser was 25 ns. The energy density of the laser was adjusted to 310 mJ/cm$^2$ by using an attenuator. The crystalline region resulting from the irradiation was observed with a secondary electron microscopy (SEM). As a result, it was confirmed that rectangular crystals of about 250-nm square had been obtained.

Thereafter, in a manner similar to Working Examples 1-1 and 1-2, the plural thin film transistors TFT were formed of which channel length L (the line width of the gate electrode) and channel width W were 20 µm and 50 µm, respectively.

Transistor characteristics of each of the obtained thin film transistors TFT were measured. The measurement results are shown in Table 4. Table 4 also shows the results on Working Examples having the same standards as those of the Comparative example (the channel length L=20 µm, the channel width W=50 µm).

TABLE 4

|  | Energy Beam | Crystalline Shape | Variation in On-state Current ±σ | Mobility (cm²/Vs) |
| --- | --- | --- | --- | --- |
| Working Example 1-2 | GaN Laser; NA = 0.6 | FIG. 6 | ±1.4% | 10 |
| Working Example 2-2 | GaN Laser; NA = 0.8 | FIG. 7 | ±1.3% | 12 |
| Working Example 3-2 | GaN Laser; NA = 0.4 |  | ±0.6% | 10 |
| Comparative Example | Excimer Laser |  | ±6.2% | 155 |

Channel length L=20 µm, channel width W=50 µm
(a process improvement is reflected in the result of NA 0.4)

Table 4 shows that the variation in the on-state current is smaller in the thin film transistors of Working Examples 1 to 3 according to an embodiment compared with the thin film transistors of the Comparative example, which did not employ one of the present embodiments. As for the FET mobility, although the Comparative example shows a higher value, the values of Working Examples 1 to 3 are also sufficiently favorable as values of pixel switches.

Furthermore, in any of Working Examples 1 to 3, in which the effective numerical apertures NA of an objective lens used for the laser irradiation are different from each other, variation in the on-state current is smaller than that in the Comparative example, which did not employ an embodiment.

According to the above-described results, it has been confirmed that if thin film transistors to which an embodiment is applied are used as switching elements for pixel electrodes in a display employing organic electro-luminescence elements, variation in the luminance among the pixels in the display can be suppressed sufficiently.

Note that the respective Working Examples and the Comparative example were performed based on an experimental process. The results on Working Examples 3-1 and 3-2 reflect an improvement in the process (specifically, handling skill) compared with the other examples.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A thin film semiconductor device comprising:
a semiconductor thin film having an active region turned into a polycrystalline region through irradiation with an energy beam; and
a gate electrode provided to traverse the active region, wherein
in a channel part that is the active region overlapping with the gate electrode, a crystalline state is changed cyclically in a channel length direction, and areas each having a substantially similar crystalline state traverse the channel part,
wherein amorphous areas and crystalline areas that traverse the active region are alternately provided so that each cycle of a change of the crystalline state includes the amorphous area and the crystalline area.

2. The thin film semiconductor device according to claim 1, wherein a number of cycles of a change of the crystalline state in the channel part is set to a predetermined number greater than or equal to two.

3. The thin film semiconductor device according to claim 1, wherein the crystalline area includes crystal grains that each range across a width of the crystalline area and are arranged along an extension direction of the crystalline area.

4. The thin film semiconductor device according to claim 1, wherein the crystalline area includes crystal grains that each have a crescent shape convex in an extension direction of the crystalline area and are arranged along the extension direction of the crystalline area.

5. The thin film semiconductor device according to claim 4, wherein the crystal grains arise from scanning of the energy beam in the extension direction of the crystalline area.

\* \* \* \* \*